United States Patent
Zhuge et al.

(10) Patent No.: US 11,611,946 B2
(45) Date of Patent: Mar. 21, 2023

(54) SAMPLING SYNCHRONIZATION THROUGH GPS SIGNALS

(71) Applicant: Crystal Instruments Corporation, Santa Clara, CA (US)

(72) Inventors: James Q. Zhuge, Palo Alto, CA (US); Zhengge Tang, San Jose, CA (US)

(73) Assignee: Chrystal Instruments Corporation, Santa Clara, CA (US)

( * ) Notice: Subject to any disclaimer, the term of this patent is extended or adjusted under 35 U.S.C. 154(b) by 0 days.

(21) Appl. No.: 17/501,302

(22) Filed: Oct. 14, 2021

(65) Prior Publication Data

US 2022/0322260 A1 Oct. 6, 2022

Related U.S. Application Data

(60) Provisional application No. 63/167,785, filed on Mar. 30, 2021.

(51) Int. Cl.
*H04L 12/26* (2006.01)
*H04W 56/00* (2009.01)
(Continued)

(52) U.S. Cl.
CPC ............ *H04W 56/002* (2013.01); *H03L 7/24* (2013.01); *H03M 1/0624* (2013.01);
(Continued)

(58) Field of Classification Search
CPC .. H04W 56/002; H04W 56/005; H04L 7/0087
See application file for complete search history.

(56) References Cited

U.S. PATENT DOCUMENTS

| 5,563,607 A | 10/1996 | Loomis et al. |
| 6,104,729 A | 8/2000 | Helium et al. |

(Continued)

FOREIGN PATENT DOCUMENTS

| CN | 100498232 C | 6/2009 |
| CN | 102546071 A | 7/2012 |

(Continued)

OTHER PUBLICATIONS

Crystal Instruments, "CoCo-80X/90X" User Manual, Dynamic Signal Analyzer Mode, Jul. 23, 2018, 59 pages.
(Continued)

*Primary Examiner* — Jamal Javaid
(74) *Attorney, Agent, or Firm* — Mark Protsik; Thomas Schneck

(57) ABSTRACT

A method uses a distributed data acquisition system with multiple, physically unconnected, data acquisition units, that can be in wireless communication with a remote host, to timestamp measurement data with sub-microsecond time base accuracy of sampling clock relative to an absolute timeframe. A current absolute time is derived from messages received from a satellite radio beacon positioning system (GPS). Measurement data is sampled by each unit at a specified sampling rate. Using hardware logic, batches of sampled data are associated with corresponding timestamps representing the absolute time at which the data was sampled. Data and timestamps may be transmitted to the host. A time offset bias is compensated by comparing timestamps against a nominal time based on start time and nominal sampling rate. The sampling clock rate may be disciplined using time pulses from the GPS receiver. An initial start of data sampling by all units can also be synchronized.

16 Claims, 10 Drawing Sheets

(51) Int. Cl.
*H04L 7/00* (2006.01)
*H03L 7/24* (2006.01)
*H03M 1/06* (2006.01)
*H03M 1/12* (2006.01)
*H03K 19/003* (2006.01)

(52) U.S. Cl.
CPC ........ *H03M 1/1255* (2013.01); *H04L 7/0087* (2013.01); *H04W 56/005* (2013.01); *H03K 19/00323* (2013.01)

(56) References Cited

U.S. PATENT DOCUMENTS

| | | | |
|---|---|---|---|
| 6,735,339 | B1 | 5/2004 | Barford et al. |
| 7,656,985 | B1 | 2/2010 | Aweya et al. |
| 7,720,644 | B2 | 5/2010 | Barford |
| 7,729,889 | B2 | 6/2010 | Barford |
| 7,756,712 | B2 | 7/2010 | Huang |
| 7,795,858 | B2 | 9/2010 | Tufillaro et al. |
| 8,416,812 | B2 | 4/2013 | Radulescu |
| 8,477,812 | B2 | 7/2013 | Gurdan et al. |
| 8,688,874 | B2 | 4/2014 | Foster |
| 8,819,472 | B1 | 8/2014 | Muscha et al. |
| 8,922,421 | B2 | 12/2014 | Pomietlasz |
| 9,002,672 | B2 | 4/2015 | Reindeau et al. |
| 9,014,021 | B2 | 4/2015 | Ponnuswamy |
| 9,111,042 | B1 | 8/2015 | Mendel |
| 9,541,949 | B2 | 1/2017 | Kuzi et al. |
| 9,655,074 | B2 | 5/2017 | Di Cera Colazingari et al. |
| 10,257,798 | B1 | 4/2019 | Koelemeij et al. |
| 10,483,997 | B1 | 11/2019 | Ganesan et al. |
| 10,541,900 | B2 | 1/2020 | Sadana et al. |
| 2018/0115478 | A1* | 4/2018 | Kim ..................... H04L 43/106 |
| 2019/0182091 | A1 | 6/2019 | Bai et al. |
| 2019/0379475 | A1 | 12/2019 | Seethamraju |
| 2020/0145314 | A1 | 5/2020 | Sadana et al. |
| 2021/0041908 | A1 | 2/2021 | Sanghi et al. |
| 2021/0075584 | A1 | 3/2021 | Babich |
| 2021/0313993 | A1 | 10/2021 | Bai et al. |

FOREIGN PATENT DOCUMENTS

| | | |
|---|---|---|
| CN | 101388741 B | 12/2012 |
| CN | 105429725 A | 3/2016 |

OTHER PUBLICATIONS

Crystal Instruments, "CoCo-80X Dynamic Signal Analyzer" brochure, May 2019, www.crystalinstruments.com, 20 pages.
Crystal Instruments, "Spider DSA", User Manual, Feb. 15, 2019, www.crystalinstruments.com, 47 pages.
Crystal Instruments, "Spider-100", brochure, Integrated controller for temperature humidity and vibration control, Jun. 2016, www.crystalinstruments.com, 20 pages.
Crystal Instruments, "Dynamic signal analysis basics", CI product note No. 001, Dec. 2015, www.crystalinstruments.com, 18 pages.
U-Blox, "LEA-6 Data Sheet", 2017, UBX-14044797, www.u-blox.com, 26 pages.
Crystal Instruments, "Remote condition monitoring" CI product note No. 035, 2018, www.crystalinstruments.com, 6 pages.
Joe Begin, TechNote 138, "Transfer function measurements with APx500 Audio Analyzers", Audio Precision, application and technical support for users, www.ap.com, Feb. 19, 2019, 10 pages.
CN100498232C, English translation, 10 pages, Year: 2009.
CN101388741B, English translation, 11 pages, Year: 2012.
CN102546071A, English translation, 16 pages, Year: 2012.
CN105429725A, English translation, 16 pages, Year: 2016.

* cited by examiner

| | Nominal Time | Actual Time |
|---|---|---|
| ▷ 0 | 00:00:00.000.000.000 | 00:00:0 |
| 1 | 00:00:03.000.000.000 | 00:00:02.999.606.7... |
| 2 | 00:00:06.000.000.000 | 00:00:05.999.213.5... |
| 3 | 00:00:09.000.000.000 | 00:00:08.998.885.8... |
| 4 | 00:00:12.000.000.000 | 00:00:11.998.492.6... |
| 5 | 00:00:18.000.000.000 | 00:00:17.997.706.2... |
| 6 | 00:00:24.000.000.000 | 00:00:23.996.985.3... |
| 7 | 00:00:30.000.000.000 | 00:00:29.996.198.9... |
| 8 | 00:00:48.000.000.000 | 00:00:47.993.905.1... |
| 9 | 00:00:57.000.000.000 | 00:00:56.992.791.0... |
| 10 | 00:01:03.000.000.000 | 00:01:02.992.004.6 |

SAMPLING SYNCHRONIZATION THROUGH GPS SIGNALS

CROSS-REFERENCE TO RELATED APPLICATION

The present application claims priority under 35 U.S.C. 119(e) from U.S. provisional application 63/167,785, filed Mar. 30, 2021.

STATEMENT REGARDING FEDERALLY SPONSORED RESEARCH AND DEVELOPMENT

This invention was made with government support under contract 80AFRC21P0066 awarded by the National Aeronautics and Space Administration, Armstrong Flight Research Center. The government has certain rights in the invention.

TECHNICAL FIELD

The invention relates to measuring and testing instruments and methods with synchronizing arrangements for precise timestamping of data signals measured at widely dispersed locations, and more specifically relates to such instruments and methods that employ transmitted timestamp messages received from satellite radio beacon positioning systems (e.g., GPS, GLONASS, GALILEO) as a basis for the time measurement determinations.

BACKGROUND ART

Multiple data acquisition systems or remote ground sensing and recording units are distributed over hundreds of kilometers. An example of such a distributed system is a ground recording system (GRS) for acoustic sensing of aircraft noise. In most cases, even the closest pair of such units are physically separated by a distance greater than 100 meters from each other. There is no electrical hardware connection between any of them, each unit collecting data essentially independently of the others.

It is necessary for analysis to be able to synchronize the data sampling of the multiple units. Such systems typically employ the transmitted timestamp messages received from satellite radio beacon positioning systems (e.g., GPS, GLONASS, GALILEO) as a basis for the time measurement determinations. Each of the remote sensor units receives certain commands from a remote computer via wireless communication, and along with the GPS (or related) satellite signals, it uses those GPS signals to synchronize the sampling clocks of the analog-to-digital converters (ADCs) in the sensor unit. Accuracy in the time measurement is extremely important for precise time stamping of the sampled data. For some remote monitoring systems, a one millisecond accuracy may be adequate. However, in some acoustic-sensing ground recording systems, the various remote sensors may need to be operated so that all live data records are time-stamped to at least 10 µs accuracy. Other remote condition monitoring applications could have similar, or possibly even more stringent, accuracy requirements.

In a typical data acquisition system, a processor, running software in the form of either a CPU polling or interrupt service routine (ISR), handles the data from the ADCs to apply a time stamp to the acquired data. However, when the data reaches a FIFO (usually a circular buffer) of the processor to receive its time stamp, a variety of factors can create timing errors or latency. Some of the sources of such timing errors or latency in a processor include: (1) when a software subroutine like ReadTime( ) is called, the actual time of hardware execution of the routine by the processor reading the external time source (the GPS time register) cannot be guaranteed at better than 1 millisecond accuracy, and can be as large as several milliseconds;
(2) the ADC conversions on different devices driven by different readings of time sources will start at completely different absolute times, leading to time differences in the data from different remote units;
(3) ISR latency and resultant time jitter in applied time stamps can be as large as a few hundred microseconds; and
(4) in multi-thread programming, a CPU interrupted for a period of time to perform other tasks in parallel with the handling of incoming data will have FIFO pointers changing significantly, such that the time stamping of live data streams will not be accurate. Accordingly, in real-time data acquisition, applying time stamps at the software level is unlikely to achieve an accuracy better than 100 microseconds under the best of circumstances.

To meet a requirement of 10 microsecond timestamping accuracy or better, a different approach is needed.

Crystal Instruments Corporation of Santa Clara, Calif., supplies a series of Spider and CoCo dynamic signal analyzer and vibration data collector products in which multiple distributed measurement devices, which can be located hundreds of meters apart, are synchronized over a single Ethernet cable (the same cable as used for data transmission), using the IEEE 1588 Precision Time Protocol (PTP) to synchronize the ADC sampling clocks of the physically connected units. The sync timing of ADC clocks in the local area network can be as accurate as 50 ns, and the measurement data of up to 512 input channels are time stamped to that same accuracy. As a result, all input channels on the same synchronization domain are sampled at the exact absolute time.

SUMMARY DISCLOSURE

A method of timestamping measurement data collected by a distributed data acquisition system with multiple, physically unconnected, data acquisition units that can be in wireless communication with a central host is provided. A series of messages broadcast from a satellite radio beacon positioning system (such as GPS) are received by each of the data acquisition units, which continuously derives from the received messages at least a current absolute time. (The current position of each unit may also be derived from the messages, especially in the case of mobile units.) Measurement data is sampled by each of the data acquisition units at a specified sampling rate and timestamps are associated to batches of the sampled measurement data by means of a hardware logic circuit, the timestamps representing to sub-microsecond accuracy the corresponding absolute time at which the measurement data was sampled. Knowing the sampling rate, each individual measurement datum in a batch has its own accurately established measurement time. This represents a marked improvement over prior software-based methods of timestamping measurement data. The sampled measurement data with their associated timestamps are transmitted by each of the data acquisition units to the system's central host.

In a further improvement to the method, the central host in a post-data-gathering step may determine and apply bias corrections to the measurement data. Specifically, time offsets for each measurement data sample are determined by a comparison by the central host of timestamps associated with the sampled measurement data against corresponding nominal times. Such nominal times are based on a known sampling start time, a nominal data sampling rate, and number of measurement data samples. The time offsets are the difference between absolute time values represented by the timestamps and the corresponding nominal times. From the set of determined time offsets for the measurement data obtained from a given data acquisition unit, a linear bias correction of time offset versus nominal time is computed, which is then applied to the time-stamped measurement data to obtain data with bias-corrected timestamps.

For even better measurement data time accuracy against absolute time that would facilitate better cross-channel analysis of the data, the sampling rate by each data acquisition unit can be disciplined by time pulses obtained from the received messages broadcast from the satellite radio beacon positioning system. The GPS clock output can be used to discipline the local sampling clock to reduce any sampling rate drift on the part of each unit's local sampling clock (normally expected to be around 10 ppm). Still further, the sampling start times for all the data acquisition units can be synchronized. Specifically, the hardware logic circuit of each data acquisition unit may receive a host command from the central host designating a planned sampling start time. Each ground recording unit would then simultaneously start its sampling of measurement data when the current absolute time derived from the received messages reaches the planned sampling start time. Both solutions simplify the post-processing of data, because if the sampling rate varies to much (local clock drift) or sampling is not properly phase synchronized, then the offset versus GPS absolute time might be too large and unpredictable to adequately correct. Hence, these clock and sampling synchronization approaches improve the potential accuracy of cross-spectrum calculations.

Hardware for carrying out the method in each data acquisition unit of the system will generally include a satellite radio beacon positioning system receiver to derive the current absolute time from the received satellite messages, the current absolute time being stored in a time register accessible by the data acquisition unit. The sampling of the measurement data is performed by an analog-to-digital converter with a sampling rate controlled by a sampling clock, where the sampling clock may be disciplined using time pulses obtained from received messages by the satellite radio beacon positioning system receiver. The hardware logic circuit that associates timestamps to batches of the sampled measurement data will usually be a field programmable logic array (FPGA). In one embodiment, the FPGA is coupled to a time register output of a satellite radio beacon positioning system receiver and is configured to apply a timestamp accessed from the time register output to batches of the sampled measurement data, the field programmable logic array supplying timestamped measurement data on a data output thereof. Alternatively, a digital signal processor is coupled both to an output of the hardware logic circuit and to a time register output of a satellite radio beacon positioning system receiver. The sampled measurement data is received and buffered by the hardware logic circuit in batches, and the digital signal processor accesses both batches of sampled measurement data and an associated timestamp from the time register output in response to a hardware interrupt from the hardware logic circuit. Again, knowing the ADC's clock-driven sampling rate, each individual measurement datum in the batch has its own accurately established measurement time.

DETAILED DESCRIPTION

Figure 1:
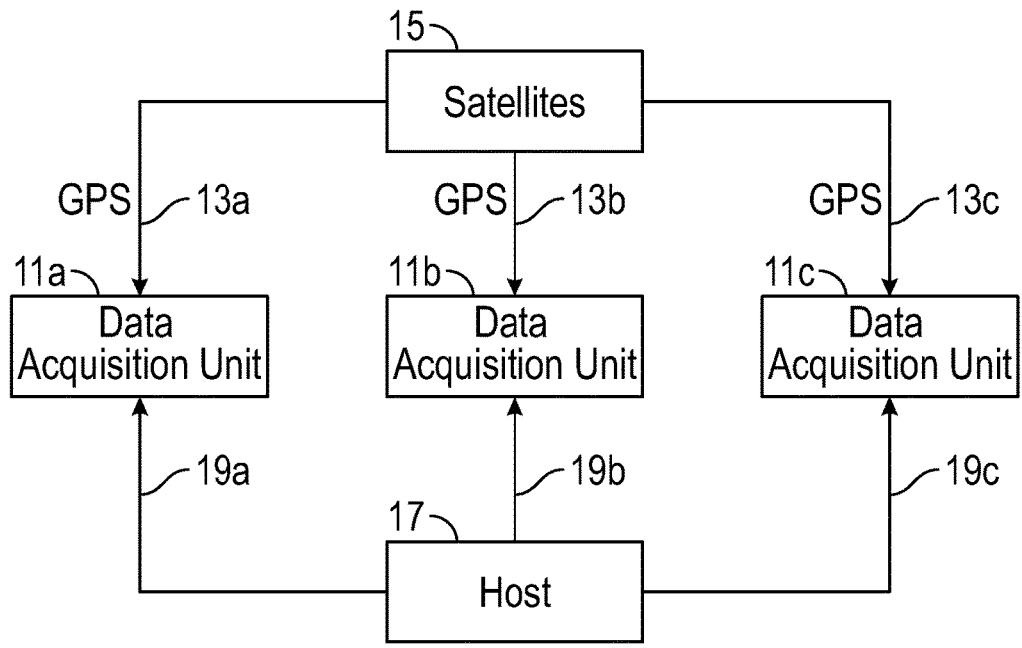
FIG. 1 is a schematic plan view of a satellite synchronized, distributed data acquisition system having features common to both the prior art and the present invention, and that can be used to carry out a method in accord with the present invention.

With reference to FIG. 1, a distributed data acquisition system has a set of recording units 11a-11c (often fixed ground units, but mobile units including some onboard aircraft flying above ground at various altitudes are also possible) to provide analog-to-digital sampling of measurement data by each of those units 11a-11c. These data acquisition units 11a-11c also receive streams of broadcast radio messages 13a-13c from a constellation of orbiting satellites 15 that together form a satellite radio beacon positioning system, such the United States' Global Positioning System (GPS), the Russian Federation's Global Navigation Satellite System (GLONASS), the European Union's GALILEO system, or any of the regional satellite navigation systems provided by India, China, or Japan. The stream of received satellite radio messages 13a-13c contain satellite position and absolute time information useful not only for determining a data acquisition unit's current position on (or above) the Earth's surface, but also for time stamping and synchronization of the data collection, even when the multiple units 11a-11c of the system are widely distributed over many square kilometers. The data acquisition units 11a-11c can also receive wireless radio command signals 19a-19c from a remote host 17. The overall system in FIG. 1 shows what is common to both the present invention and some prior art remote condition monitoring systems. The difference resides in the specific manner of using the received satellite messages 13a-13c by the data acquisition units 11a-11c to timestamp the sampled measurement data. The present invention enables timestamping with 10 µs accuracy or better relative to the same absolute timeframe (such as Coordinated Universal Time or UTC) for data synchronization among the widely distributed data acquisition units 11a-11c.

Figure 2:
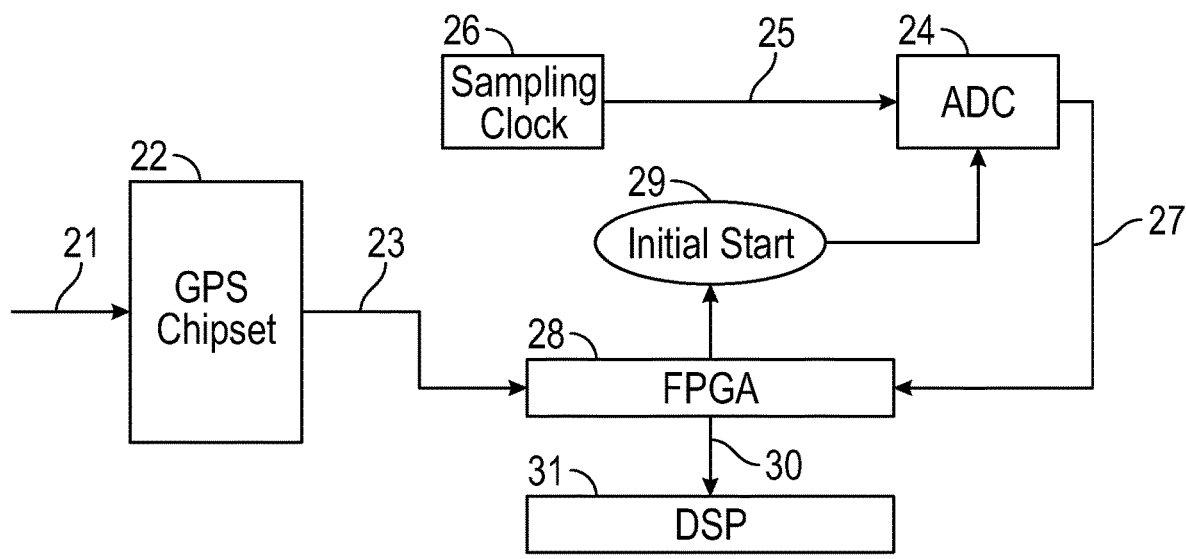
FIG. 2 is a schematic view of a basic embodiment of a synchronization circuit for a ground recording unit that implements a method in accord with the present invention.

With reference to FIG. 2, a basic embodiment of a synchronization circuit for a data acquisition unit has a satellite radio beacon positioning system receiver with a time register, such as an appropriate antenna 11 to receive the satellite messages, a GPS chipset 12 for processing those messages to derive a position and an absolute time maintained in the chipset's time register, and a time register output 13 providing the absolute time value to the rest of the circuit. An example of a GPS chipset 12 that may be used is any of the LEA-6 high-performance stand-alone GPS receiver modules supplied by u-blox AG of Thalwil, canton of Zurich, Switzerland. The GPS timing accuracy under good signal conditions is better than 60 ns with 99% probability according to the specifications of this chipset. GALILEO and GLONASS capable receivers are also available in this chip series. Similar receiver modules from other manufacturers might also be used.

An analog-to-digital converter (ADC) 24 handles the incoming measurement data. An ADC requires a clock 26 with a specific oscillator frequency to drive its sampling. These might include 16.384 MHz, 20.97152 MHz, and 26.2144 MHz, which are configured to match specific sampling frequencies, such as 102.4 kHz or 81.92 kHz. The clock 26 outputs its oscillator signal 25 to drive the data sampling by the ADC 24, which in turn outputs the sampled measurement data 27 in digital form.

A hardware logic circuit 28, which is typically in the form of a field programmable gate array (FPGA), receives the sampled data 27 on one of its inputs and the absolute time value (e.g., UTC) from the time register output 13 of the positioning system receiver chipset 12 on another of its inputs, applies a timestamp to the sampled measurement data and outputs that time-stamped data 30, for example to a digital signal processor (DSP) 31 for analysis. The FPGA logic circuit 28 will also manage the initial starting time of ADC conversion via a starting command 29 to the ADC 24.

Specifically, for hardware timestamping operation, the data 30 is sent to the DSP 31 in buffers, where the DSP reads the absolute UTC time from the applied timestamp in a data frame of that received data. Unlike a processor that may encounter many timing errors and latency, an FPGA or other hardware logic circuit 28 conducts tasks with absolute consistency. All its operations are operated at the nanoseconds level with precision timing. By the time the DSP 31 reads the live data, the data already been timestamped by the hardware logic circuit 28.

Figures 3, 4:
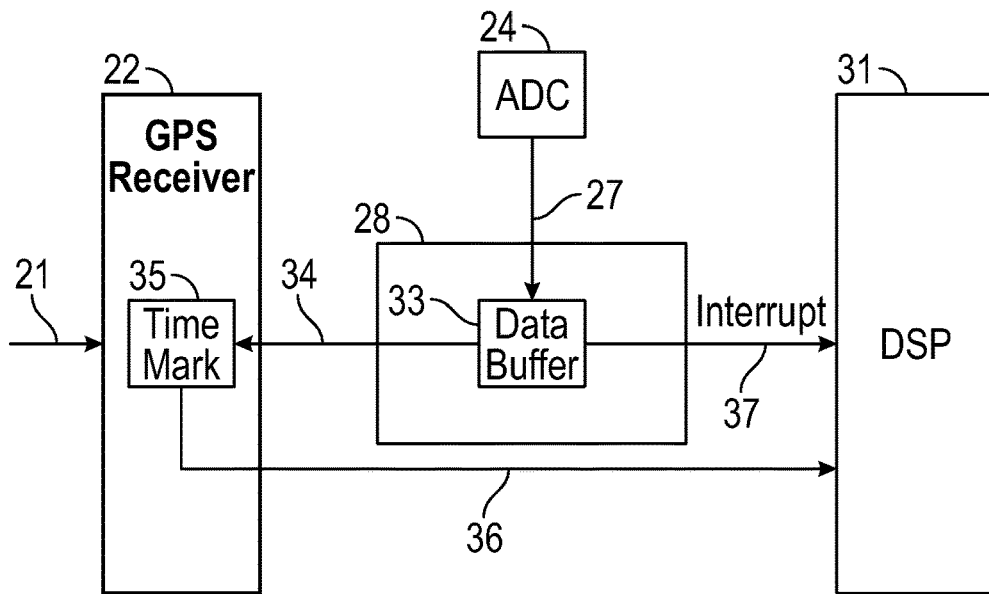
FIG. 3 is a schematic view showing one way the hardware logic circuit in the synchronization circuit as in FIG. 2 can apply time stamps to the sampled measurement data in accord with an embodiment of the present method.
FIG. 4 is a table of a sequence of measurements with a nominal time of acquired samples based on starting time, number of samples and sampling rate, and with an actual measured time taken from the GPS timestamps corresponding to the samples.

With reference to FIG. 3, one way the hardware logic circuit or FPGA 28 can apply the time stamp is using a data buffer and a hardware interrupt to the GPS receiver circuit 22. An antenna 21 receives the satellite signals and the GPS receiver 22 decodes them into timing information. The receiver 22 can also receive an external interrupt 34 from the FPGA 28 and saves the current time mark in a register 35 at the instant when it receives the interrupt. After this time mark is obtained, the receiver 22 can transmit the value of this time mark through a serial UART port 36.

After the ADC 24 starts sampling measurement data 27, that data will come into a data buffer 33 in the FPGA 28, where the buffer has a length that can store L measurement points. The reason to have a buffer 33 is that we don't want the DSP 31 reading it too frequently. Instead, after the buffer's last point is filled, the FPGA 28 will send a hardware interrupt 34 to the GPS receiver 22. Within less than 1 µs, the GPS receiver 22 will pass the current time mark to its register 35. After that process is finished, the FPGA will inform the DSP 31 by sending an interrupt 37. The DSP 31 will read the data in the FPGA's buffer 33 and the time mark in the GSP receiver's time register 35. It will associate the measured data by its counter since the ADC 24 reset to the time mark. Both measured data and time marks will be recorded. But the frequency of saving time marks do not need to be as frequent as measured data because we know the nominal sampling rate of the ADC's clock and any sampling clock drift is very slow.

Figure 5:
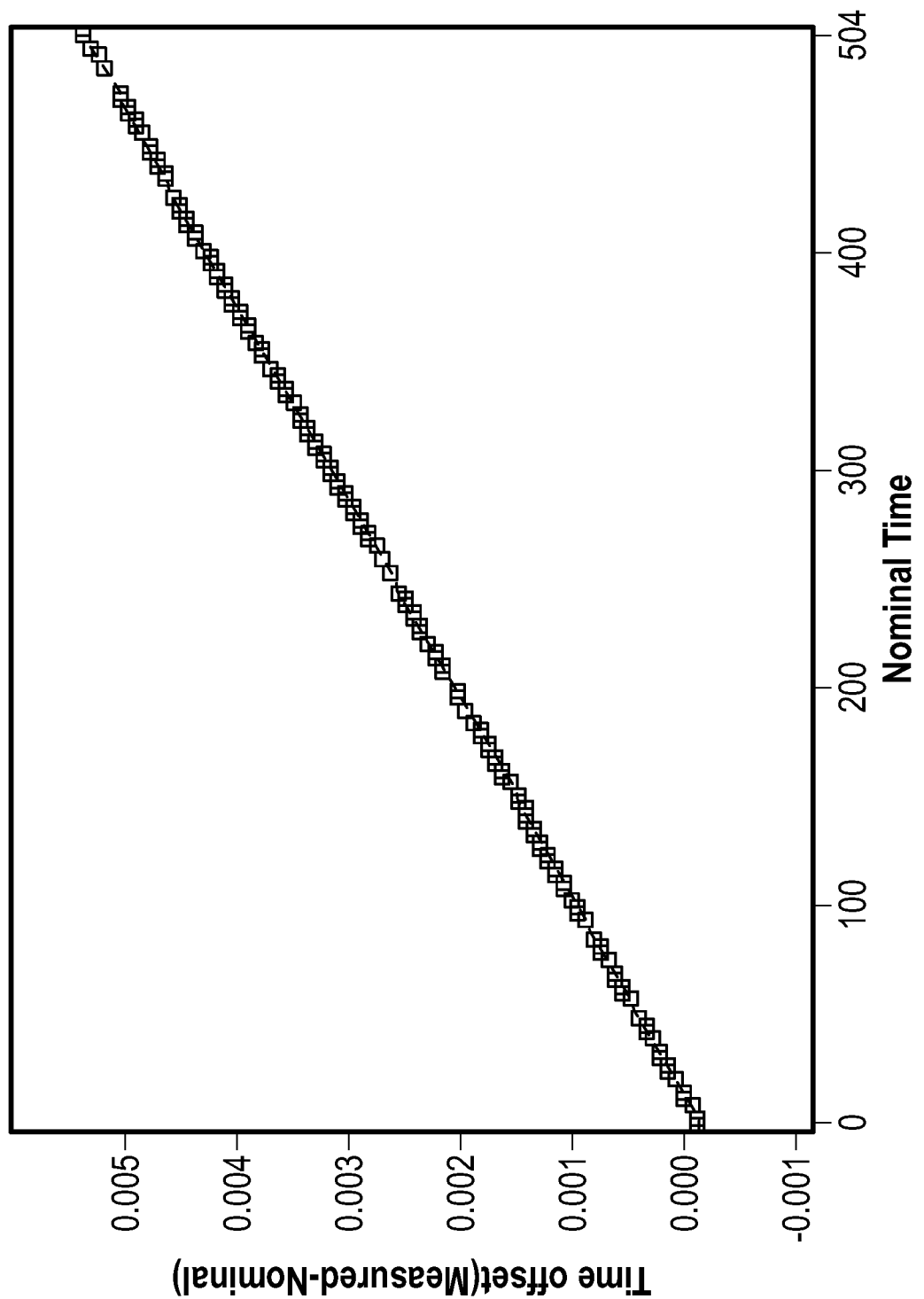
FIG. 5 is a plot of the measured-nominal time difference versus nominal time.

Upon implementing the hardware timestamping strategy of the present invention, it is discovered that a dominant error factor is bias between the local sampling clock against GPS absolute time, even more so than random drift. A ground recording instrument can record the time stamps in a lower data rate of one timestamp every several seconds. A "nominal sampling rate" is the presumed sampling rate of the instrument. A "nominal time" is the time of acquired signal samples calculated based on the starting time, number of samples, and the nominal sampling rate. The "actual time" or "measured time" is the absolute time taken from the time stamps corresponding to the samples of acquired signals. For example, FIG. 4 shows a typical table of a sequence of measurements with a nominal time of acquired samples and with an actual measured time. FIG. 5 is a plot of the measured-nominal time difference versus nominal time. Plotting the measurement data in this way we can see that after roughly 500 seconds of measurement the nominal time is off by 5 milliseconds against the GPS time. In this case the local clock is a bit slower than its nominal sampling rate with a resultant error of 10 ppm (=5 ms offset/500 s of measurement). While this is within the range of expected error of the oscillator used as the unit's sampling clock, it is still too large to conduct signal processing when cross-channel computation is needed. For such processing, the time offset must not exceed 20 µs, and in many vibration and acoustic applications must be within only few microseconds of each other.

Each data acquisition unit has its own internal oscillator (s) to use as its sampling clock, each of which has its own unique deviation from the nominal sampling rate or bias amount. The bias can be as high as 70 ppm in some units. However, because we know it is a bias, instead of random drift, and the amount of bias can be measured prior to deployment of each data acquisition unit, the measurement time can be corrected to account for that known bias. Here, a "corrected sampling rate" is a single constant value for the entire duration of a recording. It is calculated by removing the offset between local clocks against that of GPS time, based on nominal sampling rate, time offset, and measurement duration.

Figure 6:
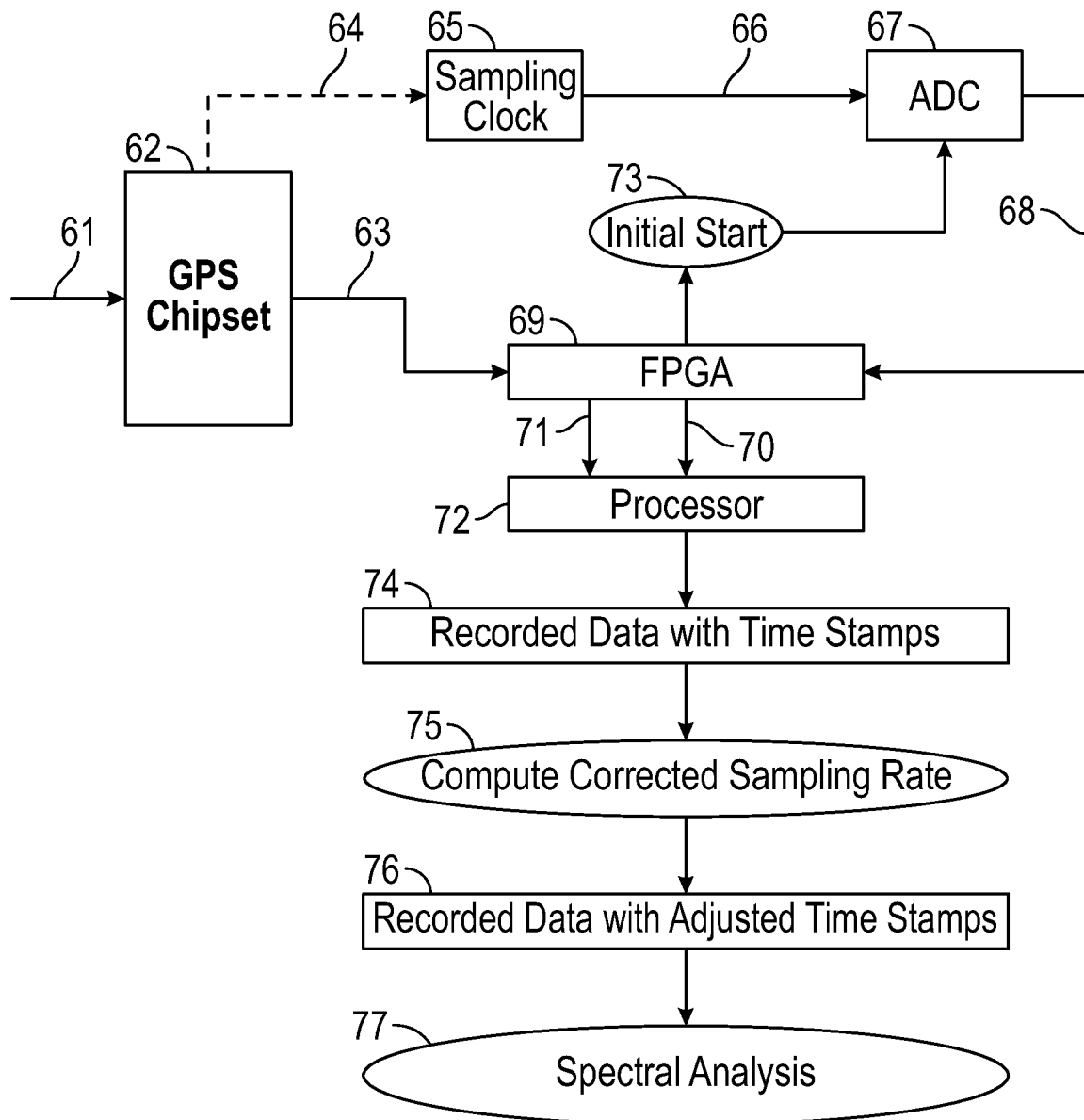
FIG. 6 is a schematic view of a synchronization circuit embodiment for a ground recording unit employing a sampling clock bias adjustment to the recorded measurement times in accord with one feature of the present method.

With reference to FIG. 6, a preferred third synchronization circuit embodiment for a data acquisition unit employs a sampling clock bias adjustment to the recorded measurement times. Again, the main section of this circuit is essentially the same as that in FIG. 2. As before, a data acquisition unit has a satellite radio beacon positioning system receiver with a time register, such as an antenna 61 to receive the satellite message stream, a GPS chipset 62 for processing those messages to derive a position and an absolute time maintained in the chipset's time register, and a time register output 63 providing the absolute time value to the rest of the circuit. An analog-to-digital converter (ADC) 67 coupled to the sampling clock 65 handles the incoming measurement data. The clock 65 outputs its oscillator signal 66 to drive the data sampling by the ADC 67, which in turn outputs the sampled data 68 in digital form. A hardware logic circuit 69, which is typically in the form of a field programmable gate array (FPGA), receives the sampled measurement data 68 on one of its inputs and the absolute time value (e.g., UTC) from the time register output 63 of the positioning system receiver chipset 62 on another of its inputs, applies a timestamp to the sampled measurement data and outputs that time-stamped data 70, for example to a digital signal processor (DSP) 71 for analysis. (Again, the timestamped data in the DSP can be in the form of two buffers of data, one containing measured data and a second containing associated time stamps received from the time register output 63. A time stamp may be saved for every fixed number of data points, e.g., approximately every 5 seconds.) The FPGA logic circuit 69 will also manage the initial starting time of ADC conversion via a starting command 73 to the ADC 67. At this point, the recorded measurement data and associated time stamps 74 still have a time offset bias due to the internal oscillator or sampling clock 65 running slightly faster or slower than its nominal rate.

A processor, e.g., in a remote host computer, receiving the recorded measurement data and time stamps 74 will compute 75 a corrected sampling rate using first order approximation, apply it to the recorded data 74 and thereby obtain recorded measurement data with adjusted (corrected) measurement times 76 that can be used for subsequent spectral analysis 77 or other cross-channel analyses. The bias correction is a software process carried out by such a processor, not necessarily part of the data acquisition unit, and can be performed much later than the data acquisition.

In more detail, the correction process comprises:
1. Calculate the time offset (as shown, for example, in the FIG. 5 plot based on measurement data from FIG. 4) for an entire duration of measured signals, such as 500 seconds.
2. Based on the measurement duration and the time difference between nominal time and GPS time stamps, we calculate the actual sampling rate as:

Actual sampling rate=Nominal sampling rate/(1+ Time Offset/Measurement Duration).

3. The bias time adjustment for each measurement is computed by removing the first-order error to the nominal sampling rate. It normally does not take into consideration any fluctuation of the sampling rate (drift) during this period.

For example, if the Nominal Sampling Rate is 64 kHz, the Time Offset is 0.005 second, and the Measurement Duration is 500 seconds, then the Actual Sampling Rate is 64 kHz/ 1.00001=63.99936 kHz. Since we know that the signals acquired on this unit are recorded with a slower clock, we can adjust the recorded measurement times during post-processing. This actual sampling rate will be specific to a particular oscillator of each ground recording unit. The distributed system's remote host computer may store a list of actual sampling rates for each data acquisition unit in the system.

Figure 7A:
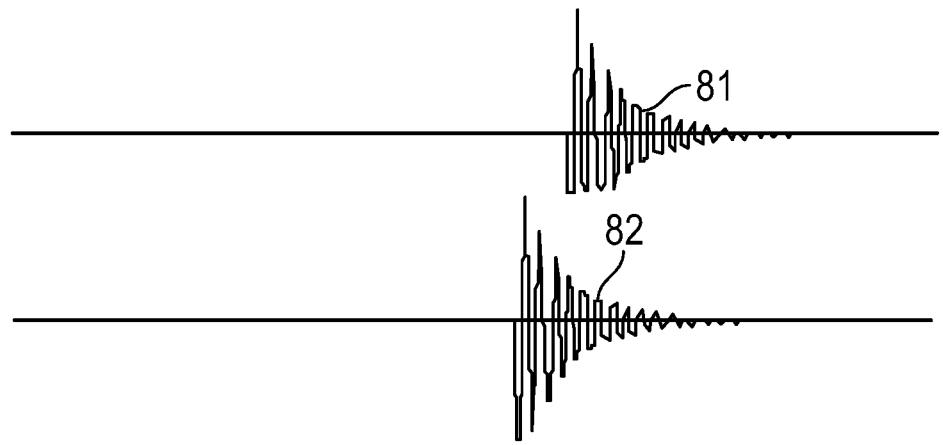
FIGS. 7A and 7B are respective graphs of pairs of measured signals, where the first pair in FIG. 7A from different ground recording units exhibit sampling clock bias in the recorded measurement times, and where the second pair in FIG. 7B show the result of sampling clock bias adjustment by the FIG. 6 embodiment.
Figure 7B:
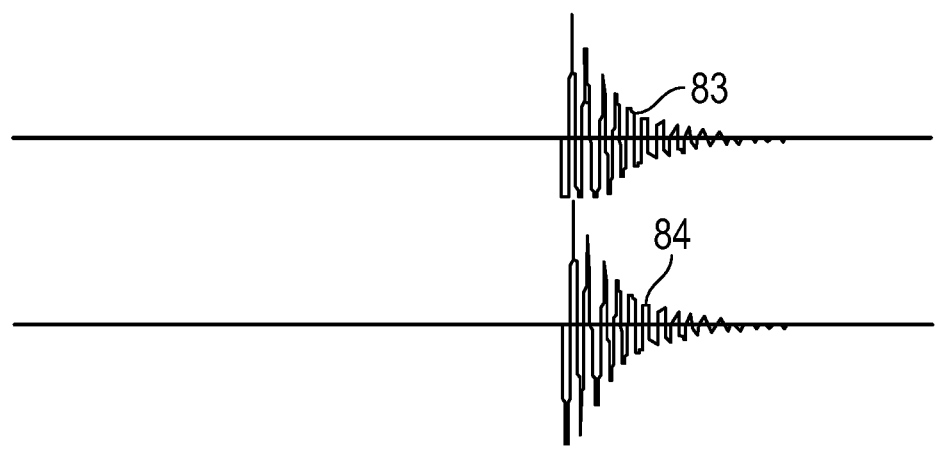

FIGS. 7A and 7B illustrate the beneficial effect that such sampling clock bias adjustments can have upon cross-signal analysis of data obtained from different data acquisition units. In FIG. 7A, an impulse event is simultaneously recorded by two different data recording units. Because of their time offsets, the corresponding waveforms 81 and 82 obtained from the measured data do not temporally align. The two signal measurements will be offset by a certain duration even if they have the same starting time-base (as recorded by the two units, waveform 81 is seen to have a later measured time than waveform 82). In FIG. 7B, after correction against the GPS timestamps, the time adjusted waveforms 83 and 84 now line up. After such sampling clock bias adjustment, all classical processing methods, such as fast Fourier transform (FFT), frequency response function (FRF), coherence function, etc. can be used.

Figure 8A:
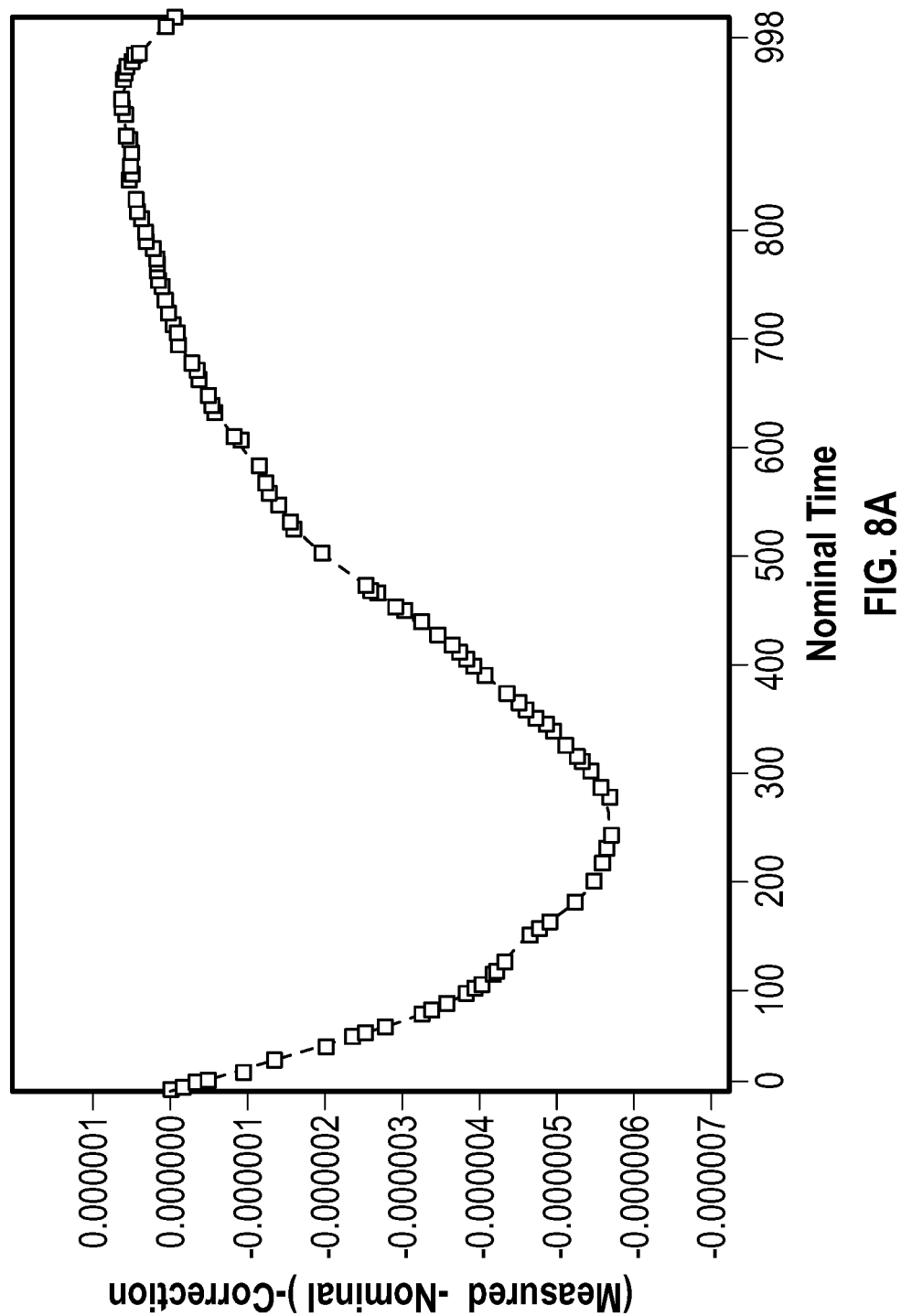
FIGS. 8A and 8B are plots of the measured-nominal time difference after bias correction versus nominal time for two different ground recording units, illustrating residual sampling clock drift.
Figure 8B:
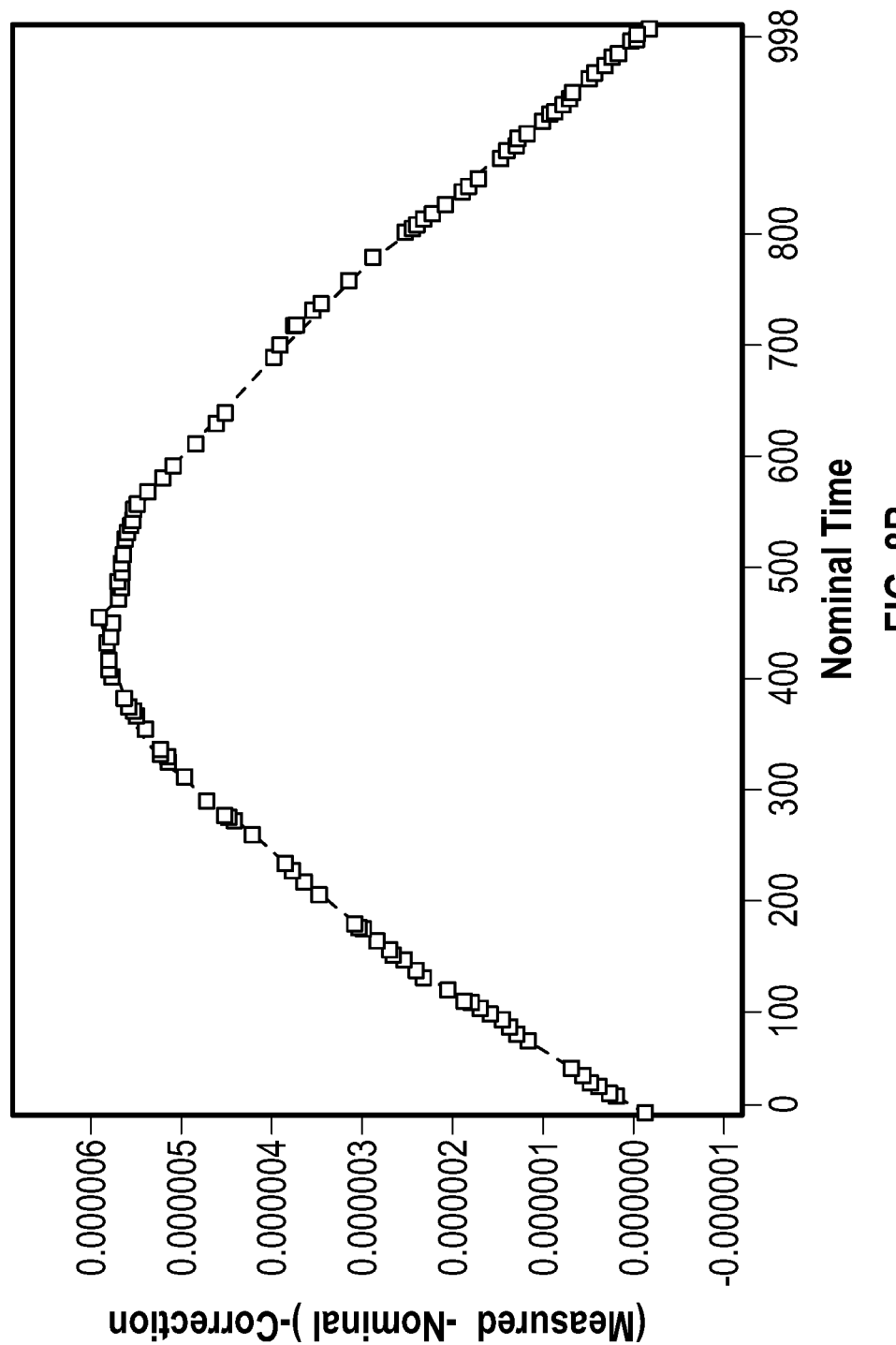

FIGS. 8A and 8B show the adjusted time offset of two signal measurements on different data acquisition units after the bias corrections have been applied. The vertical axis shows (measured time–nominal time)–bias correction in seconds in relation to a measurement duration of roughly 1000 seconds (the horizontal axis). This illustrates that the sampling clock drift over that measurement, which is seen to be at most 6 μs. (Use of the GPS clock to adjust the ADC sampling clock, as in FIG. 11 below, is one way to compensate for such residual drift and minimize its impact.)

An advantage of employing this bias correction technique is that now a user can apply cross-term computations to all acquired data from different distributed devices. For example, a user can calculate transfer functions (FRF), cross-spectrum, correlation function, or coherence function between data from any two or more input channels from separate data acquisition units. In the case, for example of acoustic sensing of aircraft noise, synchronized timing between multiple ground recording units located several kilometers apart will help to accurately determine sound propagation delay, which can complement determination of atmospheric turbulence on sonic boom signature measurements. (In the embodiments discussed below with reference to FIG. 10-13, still further features that account for sampling clock drift and synchronized sampling starts will enhance this cross-term computation capability even more.)

Timestamps may become unavailable from time to time due to a loss of signal from one or more GPS satellites. And even with good receiving conditions, a receiver-derived timestamp might sometimes exhibit occasional discontinuities. Either of these situations is still acceptable because the internal oscillator continues to run. The accuracy and stability of this internal oscillator is sufficient for a short duration until the GPS satellite signal is reacquired. The timestamps do not need to be continuous, so long as we can get a rough curve of the set of timestamps to be able to identify and then eliminate erroneous time stamps. If the system has recorded two or more timestamps during the entire data acquisition, it can derive first order (or even higher order) trends of the clock difference and interpolate the appropriate time stamp correction. Even if only one timestamp is obtained over an entire duration of data acquisition, the sampled measurement data will be stamped with single timestamp point. That is still much better than the case that we don't have any GPS time references, because now we know the signal is acquired with time certainty of milliseconds.

Figure 9:
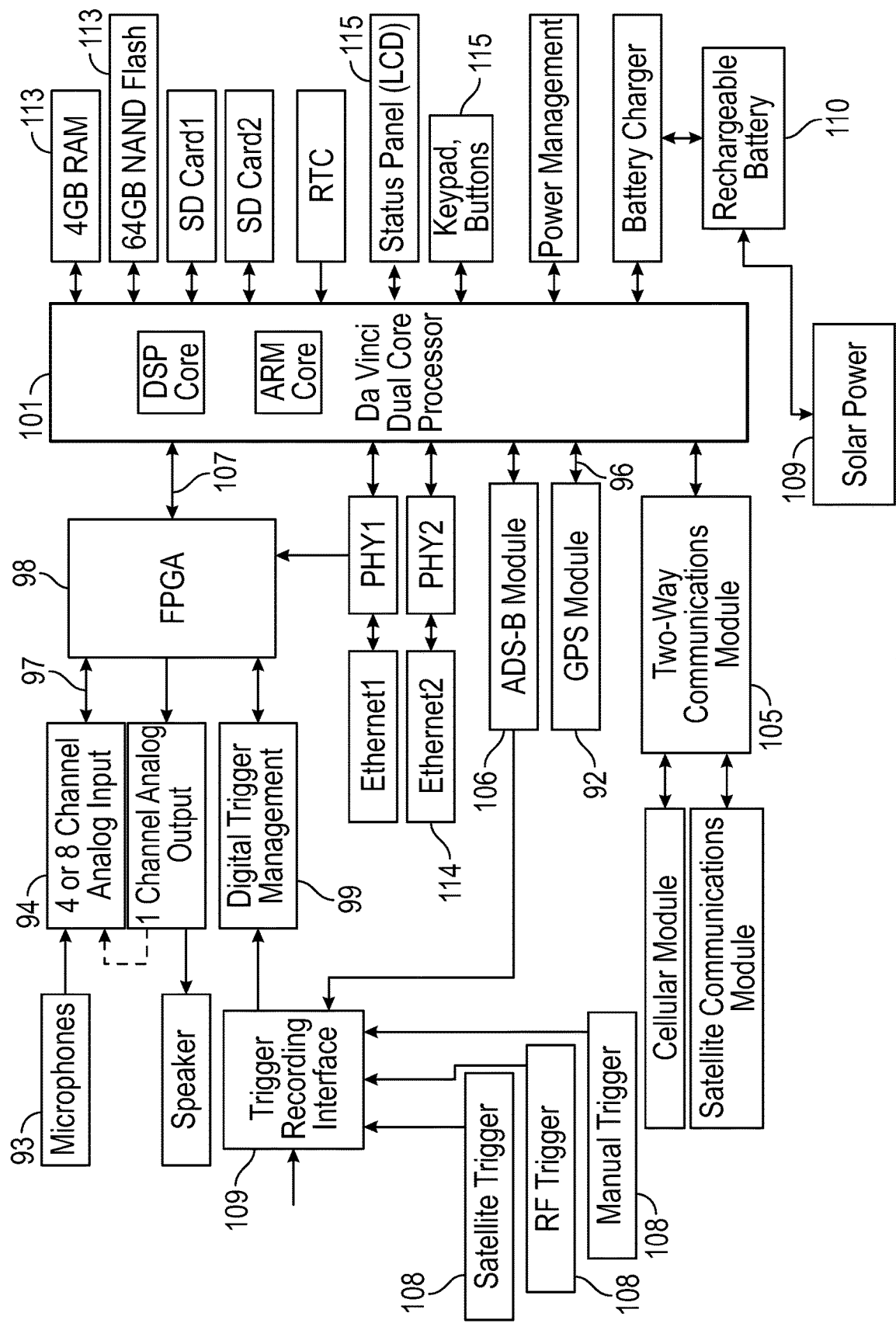
FIG. 9 is a schematic view of an overall hardware architecture of a ground recording unit that may be used to carry out a method of the present invention.

FIG. 9 shows the overall hardware architecture of one possible data acquisition unit implementing the invention. Location accuracy provided by the GPS chipset 82 is roughly 2.5 meters. Data acquisition units are often stationary ground recording units (a fixed position), but mobile (even airborne) units are also possible. The GPS module 92 provides a time register output 96 that can be directly accessed by a dual-core processor 101 with a digital signal processing (DSP) core. GPS timing accuracy provided by the GPS module 92 is better than 60 ns with 99% probability. Analog-to-digital converters 94 receive analog measurement signatures from sensors, such as microphones 93, with multiple input channel capability (e.g., 4 or 8 analog input channels), and supply sampled digital measurement data 97 to buffers of an FPGA 98. When buffers are full, the FPGA 98 sends an interrupt over a bus 107 to the processor 101, which then accesses both the measurement data over the bus 107 and GPS time mark over the time register pathway 96. The FPGA 98 is hardware that conducts its programmed tasks with absolute consistency. All its operations are operated at nanoseconds level with precision timing. Ethernet connections 114 can be provided for programming various internal functions of the processor 101, the FPGA 98, and the GPS module 92. A two-way communications module 105 (possibly provided with both satellite and cellular communication capability) permits handshaking and receipt of an absolute sampling start time from a host computer. The start time can then be handled by the processor 101 through an ADS-B module 106 and trigger recording interface 107. Other possible data sampling trigger interfaces 108 (satellite, radio frequency, manual) could also be provided for receipt of direct initial start commands. The processor 101 and other ground recording components may be solar powered 109 and have power management and rechargeable battery backup 110 for nighttime operation. Various forms of memory 113 can be coupled to the processor 101, as can input and output interfaces 115.

The foregoing improvements allow accurate timestamping of measurement data to roughly 100 ns relative to absolute time established by each unit's GPS receiver. This is about 100 times better than the 10 µs requirement of the currently most stringent monitoring systems. Additionally, any large offset bias present in the timestamped data can be adjusted with well designed post processing software after the data collection to enable cross-spectrum analyses using data acquired from multiple units.

Figure 11:
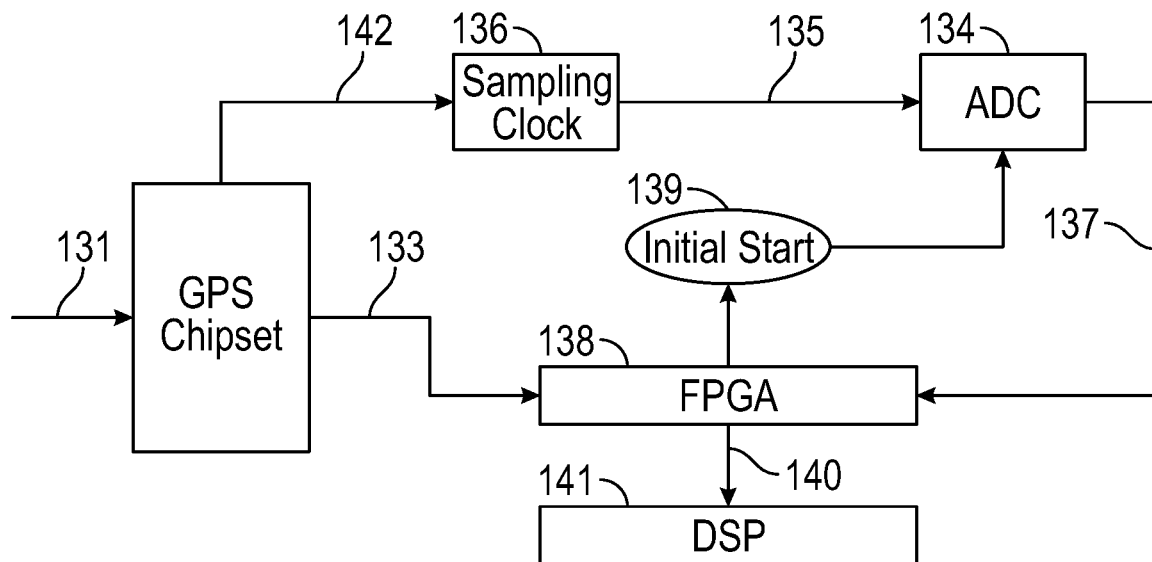
FIG. 11 is a schematic view of a third synchronization circuit embodiment for a ground recording unit employing regular adjustment of the ADC sampling clock.
Figure 12:
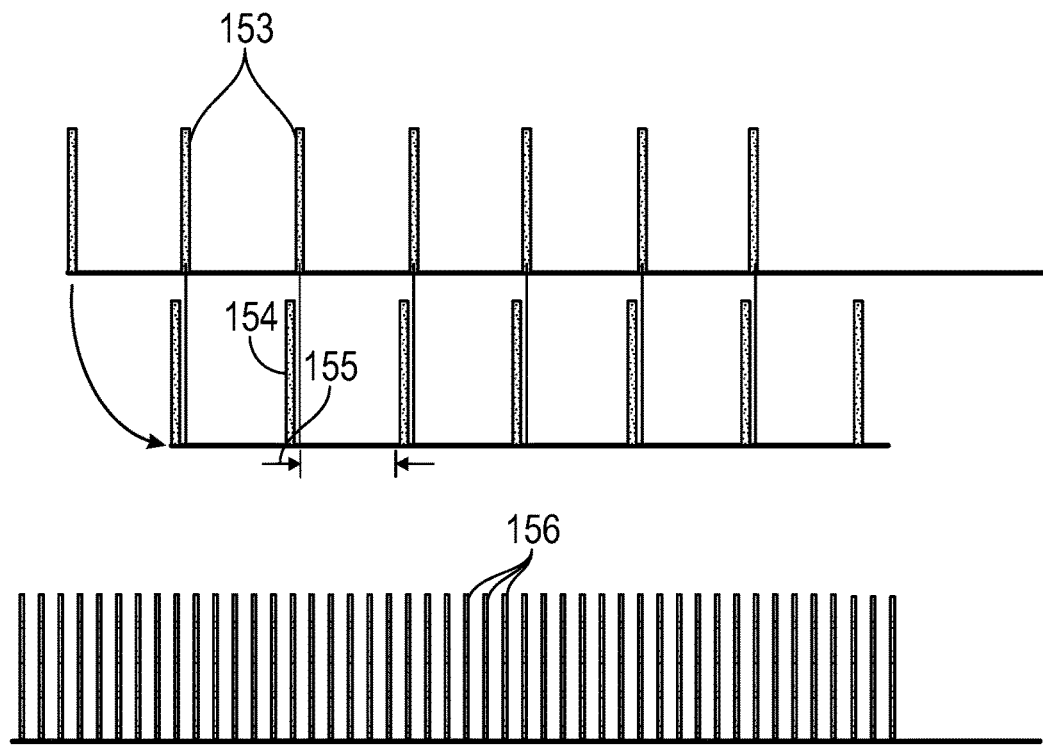
FIG. 12 is a graph of ADC sampling clock of two ground recording units and GPS time pulses versus time, showing potential phase mismatch between ADC sampling by different ground recording units.
Figure 13:
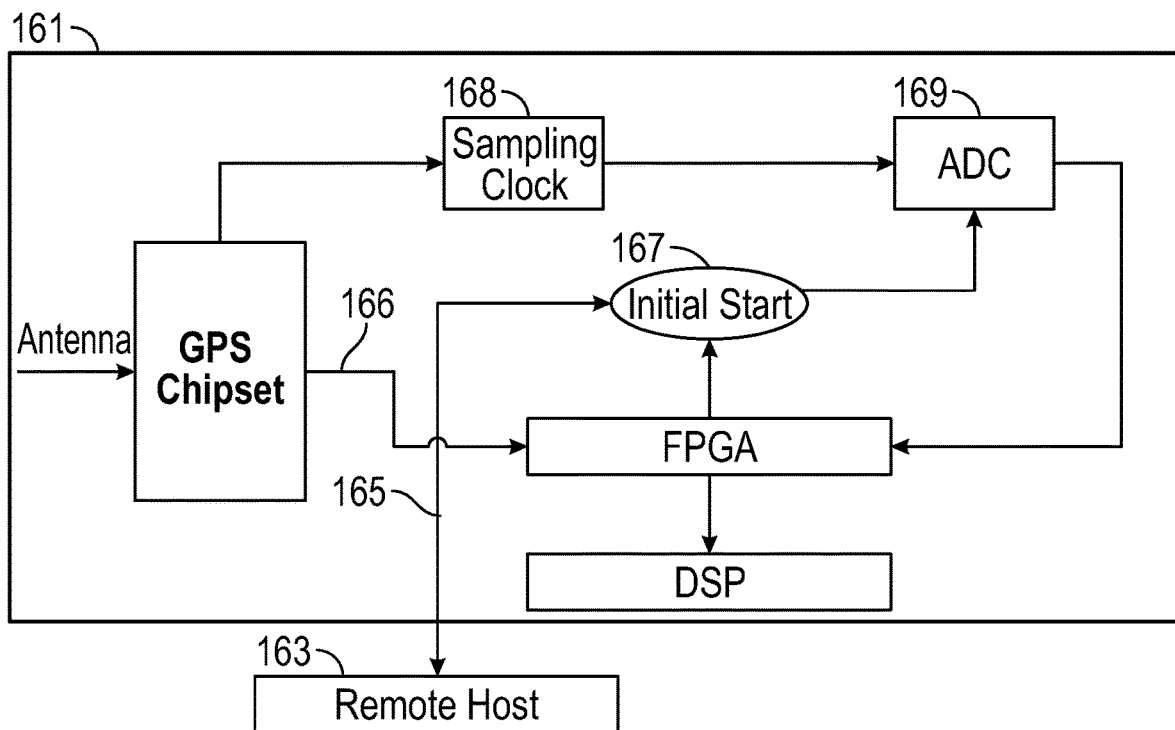
FIG. 13 is a schematic view of part of a distributed data acquisition system showing one of the ground recording units, as in FIG. 11, and a remote host providing ADC sampling clock synchronization in accord with a further feature of the present method.

A second aspect of the invention is to further improve synchronized data collection in such systems via time synchronization of the ADC clocks in the multiple data acquisition systems. This will further improve cross-spectrum calculations even in the presence of unpredictable drift of local sampling clocks. Two specific improvements are presented: (1) using GPS receiver time pulse outputs to regularly discipline the sampling rate of the local sampling clock (FIGS. 10-11); and (2) using a remote central host to communicate an absolute sampling start time of each data acquisition unit (FIGS. 12-13).

Figure 10:
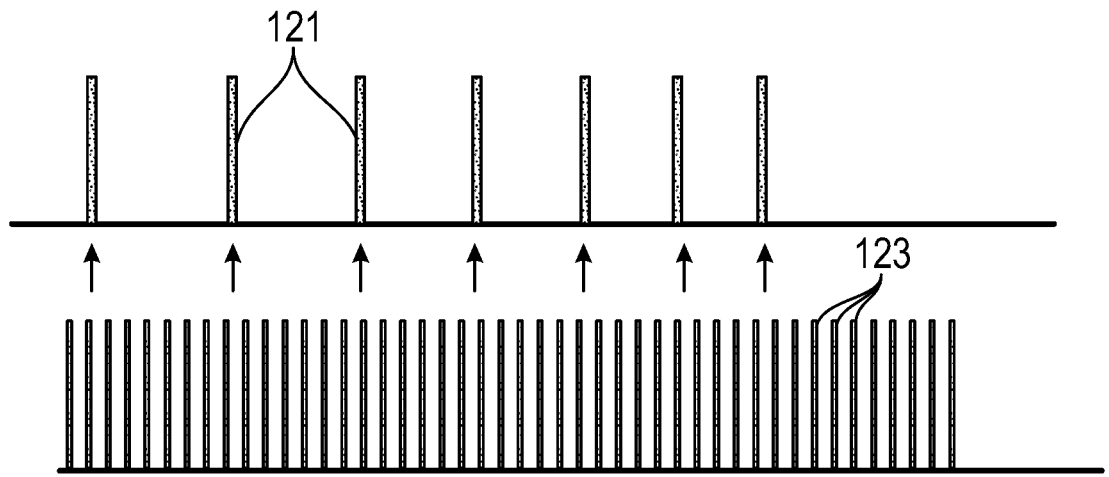
FIG. 10 is a graph of ADC sampling clock and GPS time pulses versus time, showing potential drift of the sampling clock away from standard time.

With reference to FIG. 10, the diagram illustrates ADC clock drift in concept. The incoming data sampled will be time-stamped at better than 100 ns accuracy. Because the UTC time source is from GPS (or a similar satellite beacon), the 10 MHz (or 25 MHz, depending on the GPS receiver chipset) time stamps 123 will not drift significantly away from the standard GPS time. A problem is that the ADC sampling clock 121, which is driven by an internal oscillator, may itself drift over time at about 50 ppm uncertainty. While it drifts, the sampling interval will be slightly changing over time. As seen in FIG. 10, the ADC sampling clock 121, although it nominally runs at 102.4 kHz for a sampling interval slightly larger than 10 µs, is seen under changing conditions to here be running increasingly fast with slightly shorter and shorter intervals during a data acquisition run. (The oscillator frequency could also drift in the other direction, creating longer sampling intervals, or even change drift direction.) For a recording time of merely a few minutes this would not be a major problem. However, when the recording time is as long as hours or even days this sampling clock drift may make data from different units become incomparable to each other over time.

It is highly desirable to reduce the ADC clock drift. With reference to FIG. 11, an alternative synchronization circuit embodiment for a ground recording station can provide a disciplinary logic to regularly adjust the ADC sampling clock using the clock output from the GPS receiver circuit. The overall structure of the circuitry is basically the same as in FIG. 2, but with one small, but significant, change so that the ADC sampling clock 136 can now receive timing inputs 142 from the GPS receiver circuit 132.

As before, a ground recording unit has a satellite radio beacon positioning system receiver with a time register, such as an appropriate antenna 131 to receive the satellite messages, a GPS chipset 132 for processing those messages to derive a position and an absolute time maintained in the chipset's time register, and a time register output 133 providing the absolute time value to the rest of the circuit. Time pulses are also provided on an output 142 of the GPS receiver 132. An analog-to-digital converter (ADC) 134 coupled to a clock 136 handles the incoming measurement data. The clock 136 outputs its oscillator signal 135 to drive the data sampling by the ADC 134, which in turn outputs the sampled data 137 in digital form. Now the time pulse output 142 operates to regularly keep the clock 136 synchronized with the absolute time provided by the GPS receiver 132. It is noted that a GPS or other satellite beacon signal may not be reliably accessible all the time. When a GPS signal becomes unavailable, the internal clock 56 continues to run on its own, albeit possibly with some slight drift, until resynchronized after reacquisition of the satellite GPS signal.

A hardware logic circuit 138, which is typically in the form of a field programmable gate array (FPGA), receives the sampled data 137 on one of its inputs and the absolute time value (e.g., UTC) from the time register output 133 of the positioning system receiver chipset 132 on another of its inputs, applies a timestamp to the sampled measurement data and outputs that timestamped data 140, for example to a digital signal processor (DSP) 141 for analysis. The FPGA logic circuit 138 will also manage the initial starting time of ADC conversion via a starting command 139 to the ADC 134.

This solution, while it corrects the internal clock 136 from drifting relative to absolute time and ensures accurate timestamping, still does not guarantee a good phase match between sampled data from different devices. With reference to FIG. 12, ADC sampling clocks 153 and 154 of two different data acquisition units and corresponding GPS time pulses 156 versus time illustrate a potential phase mismatch between ADC sampling by different ground recording units. The 102.4 kHz ADC sampling clock 153 is synchronized with the 10 MHz GPS time pulses 156. The 102.4 kHz ADC sampling clock 154 is likewise synchronized with the 10 MHz GPS time pulses 156. However, the two sampling clocks 153 and 154 of the two data acquisition units are not synchronized with each other. Even if all the samples are accurately time-stamped to an accuracy of 100 ns, the exact sampling times of the different devices may still be off by an arbitrary duration up to 360° phase difference, as indicated by the interval 155, which is as much as one entire data sample or about 10 µs.

To address this, the embodiment seen in FIG. 13 provides a further improvement to synchronization, in this case to the sampling time itself. A distributed data acquisition system has multiple data acquisition units (as for example in FIG. 11), one of which is shown as recording unit 161, and a remote host 163 for providing ADC sampling clock synchronization of the data acquisition units 161 via two-way communication 165. This approach will synchronize the absolute time of all ADC sampling clocks 78 on multiple units 161. The clock time synchronization will be as good as 100 ns. This feature will allow the cross-spectrum measurement between input channels on the different recording units with a phase match as accurate as ±1° at 20 kHz. It is possible whenever both GPS time source and host communication are available. To implement this sampling synchronization, the Initial Start 167 action can be driven by a global command from the host computer 163 communicated wirelessly 165 to each recording unit 161. The communicated global start command 167 will specify an exact absolute later known time to be read from the GPS receiver's time register output 166. (This is not simply the sending of a start command to all units. After a handshake protocol to ensure all units are listening, a future start time is sent and receipt by all the units is verified.) The sampling of measurement data by the ADC 169 of each data acquisition unit 161 will start at the commanded absolute time. Then, all the ADCs in the same "sync domain" can sample data at the same time to an accuracy of the UTC time stamp, say 100 ns.

What is claimed is:

1. A method of timestamping measurement data collected by a distributed data acquisition system with multiple, physically unconnected, data acquisition units all capable of outputting of timestamped data to memory and wireless communication with a central host, the method comprising:
   receiving by each of the data acquisition units a series of messages broadcast from a satellite radio beacon positioning system and continuously deriving from the received messages and storing in a time register at least a current absolute time;
   sampling measurement data at a specified sampling rate by each of the data acquisition units;
   associating timestamps to batches of the sampled measurement data received and collected in a buffer by means of a hardware logic circuit coupled to a time register output and invoking hardware interrupt to a digital signal processor, the timestamps representing to sub-microsecond accuracy the corresponding absolute time at which the measurement data was sampled; and
   sending, from each of the data acquisition units to the central host, the sampled measurement data with their associated timestamps.

2. The method as in claim 1, further comprising:
   determining time offsets for each measurement data sample by a comparison by the central host of timestamps associated with the sampled measurement data against corresponding nominal times that are based on a known sampling start time, a nominal data sampling rate, and the number of measurement data samples, the time offsets being a difference between absolute time values represented by the timestamps and the corresponding nominal times;
   computing a linear bias correction of time offset versus nominal time; and
   applying the bias correction to the timestamped measurement data.

3. The method as in claim 1, wherein the sampling rate by each data acquisition unit is disciplined by time pulses obtained from the received messages broadcast from the satellite radio beacon positioning system.

4. The method as in claim 1, wherein the hardware logic circuit of each data acquisition unit receives a command from the central host designating a planned sampling start time, each ground recording unit simultaneously starting its sampling of measurement data when the current absolute time derived from the received messages reaches the planned sampling start time.

5. The method as in claim 1, wherein the current absolute time is derived in each data acquisition unit by a satellite radio beacon positioning system receiver, the current absolute time being stored in a time register accessible by the data acquisition unit.

6. The method as in claim 1, wherein sampling of the measurement data is performed by an analog-to-digital converter with a sampling rate controlled by a sampling clock.

7. The method as in claim 6, wherein the sampling clock is disciplined by time pulses obtained from received messages by a satellite radio beacon positioning system receiver.

8. The method as in claim 1, wherein the hardware logic circuit that associates timestamps to the sampled measurement data is a field programmable logic array configured to buffer sampled measurement data and to generate a hardware interrupt whenever the buffer becomes full with a batch of the sampled measurement data.

9. The method as in claim 8, wherein the field programmable logic array is coupled to a time register output of a satellite radio beacon positioning system receiver and applies timestamps accessed from the time register output to batches of sampled measurement data, the field programmable logic array supplying timestamped measurement data on a data output thereof.

10. The method as in claim 1, wherein a digital signal processor is coupled to an output of the hardware logic circuit and to a time register output of a satellite radio beacon positioning system receiver, the sampled measurement data is received and buffered by the hardware logic circuit in batches, and digital signal processor accesses both batches of sampled measurement data and an associated timestamp from the time register output in response to a hardware interrupt from the hardware logic circuit.

11. A method of timestamping measurement data collected by a distributed data acquisition system with multiple, physically unconnected, data acquisition units all capable of outputting of timestamped data to memory and wireless communication with a central host, the method comprising:
   receiving by each of the data acquisition units a series of messages broadcast from a satellite radio beacon positioning system and deriving from the received messages at least a current absolute time;
   sampling by each of the data acquisition units of measurement data by an analog-to-digital converter (ADC) using a sampling clock connected to an input of the ADC, the sampled measurement data being supplied to a hardware logic circuit; and associating a timestamp to batches of sampled measurement data representing the current absolute time from the receiver, each of the data acquisition units including a digital signal processor coupled to an output of the hardware logic circuit and to a time register output of the receiver to obtain timestamped measurement data.

12. The method as in claim 11, wherein a central host processor receiving timestamped measurement data from each data acquisition unit is configured to compute a bias correction based on a comparison by the host processor of a measured time from a timestamp of the measurement data with a corresponding nominal time based on a start time, nominal sampling rate of the clock, and number of samples, and applies the bias correction to the timestamped measurement data.

13. The method as in claim 11, wherein the sampling clock is disciplined by time pulses obtained from the series of messages received from the satellite radio beacon positioning system.

14. The method as in claim 11, wherein an initial start of sampling of measurement data is triggered by an initial start command received from the hardware logic circuit.

15. The method as in claim 14, wherein the hardware logic circuit of each data acquisition unit receives a command from a remote central hub designating a planned sampling start time, whereby the ADC of each ground recording unit simultaneously starts sampling of measurement data at the planned sampling start time.

16. A distributed data acquisition system for collecting time-stamped measurement data, comprising a central host and multiple, physically unconnected, data acquisition units capable of outputting to memory and wireless communication with the central host, wherein each of the data acquisition units has a receiving module that is configured to receive a series of messages broadcast by a satellite radio beacon positioning system and continuously derive a current absolute time from the received messages, the receiving module having a time register for maintaining a store of the current absolute time, each of the data acquisition units further having a sampling clock, an analog-to-digital converter controlled by the sampling clock for sampling measurement data at a specified sampling rate, and a hardware logic circuit with a buffer coupled to an output of the analog-to-digital converter to receive collect the sampled measurement data from the analog-to-digital converter, the hardware logic circuit also generating a hardware interrupt whenever the buffer becomes full with a batch of the sampled measurement data, each of the data acquisition units further having a processor coupled to an output of the hardware logic circuit and to an output of the time register, the processor responsive to an invoked hardware interrupt to access both a batch of the sampled measurement data from the buffer and a current absolute time from the time register and thereby associate timestamps to the batches of the sampled measurement data representing with sub-microsecond accuracy the corresponding absolute time at which the measurement data was sampled, the batches of sampled measurement data with their associated time stamps being then sent via at least one of wireless transmission and output to memory from the processor to the central host.

* * * * *